Sept. 20, 1960 W. A. DOUGLAS 2,952,980

THERMOELECTRIC DEVICE

Filed Oct. 20, 1958

INVENTOR.
WILLIAM A. DOUGLAS
BY
Christie Parker & Hale
ATTORNEYS 2,952,980

THERMOELECTRIC DEVICE

William A. Douglas, South Pasadena, Calif., assignor to Mira Corporation, Los Angeles, Calif., a corporation of California Filed Oct. 20, 1958, Ser. No. 768,363

8 Claims. (Cl. 62—3)

This invention relates to thermoelectric devices and more particularly to an improved thermoelectric cooling device.

It has long been known that when an electrical circuit is formed of two dissimilar metals it will exhibit a thermoelectric effect and which effect may be utilized for either heating, cooling, or the generation of a minute electromotive force, E.M.F. The thermoelectric generation of and E.M.F. is known as the Seebeck effect, and which thermo E.M.F. results when a circuit is formed to include the two different metals, a thermocouple, and one of the junctions of the metals is at a higher temperature than the other. The inversion of the Seebeck effect results when a thermocouple is provided with a source of E.M.F. producing a cooling and heating action known as the Peltier effect. In accordance with the Peltier effect one junction will become heated, while the other will be cooled. The extent to which the junctions are heated or cooled by a given current passing therethrough depends solely upon the metals used. The Peltier effect is generally accompanied by another phenomenon known as the Thomson effect. The Thomson effect consists of the generation or absorption of heat by the passage of a current in a uniform conductor when there is a temperature gradient or difference in the conductor. The Thomson effect depends only on the conductor and the temperatures at the two ends of the conductor under consideration.

These thermoelectric effects have been utilized in practical devices to a limited extent until recent years since the temperature changes or E.M.F.'s produced have been very small. Recently, investigations have been directed towards materials including semi-conductors exhibiting thermoelectric properties and which materials have indicated greatly improved thermoelectric effects. These discoveries have led to intensified research efforts in this area. Accordingly most of the research has been directed towards developing materials exhibiting improved thermoelectric characteristics so as to be incorporated into commercial devices. The materials presently thought to exhibit the best thermoelectric properties fall into the semiconductor area. A comprehensive review of the thermoelectric effects appears in a text entitled "Semi-Conductor Thermoelements and Thermoelectric Cooling," by A. F. Ioffe; published by Infosearch Limited; London, England.

This invention provides an improved thermoelectric device capable of producing changes in temperature substantially below those heretofore thought possible with presently known materials. The invention provides a device having improved thermoelectric characteristics through the realization that performance of a thermoelectric couple is limited by the heat loss and controlling the loss so that the device will exhibit a preselected temperature gradient characteristic. The temperature gradient is controlled so as to have a non-linear characteristic which will limit or prevent the leakage of cold from an associated cold junction. This temperature gradient is arranged so that the elemental change of temperature adjacent the hot junction is small, while the elemental changes of temperature adjacent the cold junction has a steep slope whereby the transfer or leakage of cold between the two junctions is substantially limited. This desirable temperature gradient characteristic is preferably accomplished by making the legs of the thermoelectric material porous such as by compacting a powdered material and sintering. The porous material is further arranged in combination with a heat transfer fluid which is directed along the axis of the thermoelectric cells towards the cold junction to provide the desired temperature gradient characteristic. This novel arrangement of elements produces a substantial reduction in temperature of any heat transfer fluid passing adjacent the cold junction.

These and other features of the present invention may be more fully appreciated when considered in the light of the following specification and drawings, in which.

Figure 1:
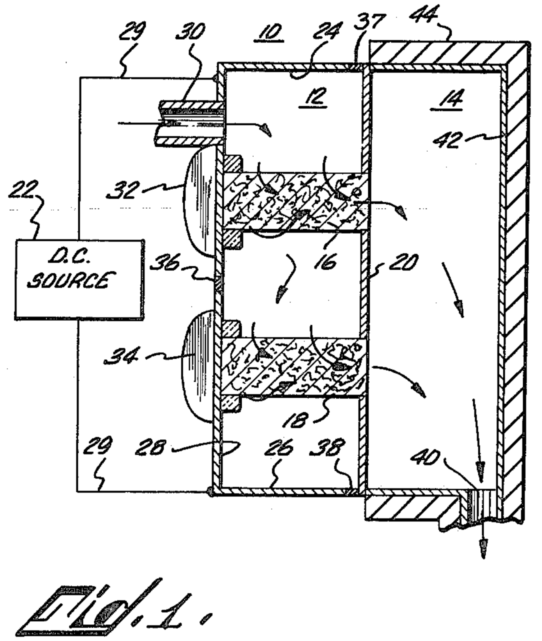
Fig. 1 is a cross-sectional view of a thermoelectric device embodying the invention.

Referring now to Fig. 1, the novel thermoelectric device 10 will be described. The thermoelectric device 10 comprises a thermoelectric cell storage chamber 12 and a refrigerated chamber 14. The storage chamber 12 is provided for storing the thermoelectric cells or elements 16 and 18 shown as a pair of semi-conductor rods joined by a metallic connecting bridge 20. One of the thermoelectric elements 16 and 18 comprises an N-type semiconductor element while the other element is P-type and which elements are connected to a direct current voltage source 22. The voltage terminals for the source 22 are arranged relative to the N and P type rods to provide a cold thermoelectric or heat absorption junction at the right hand end section of each rod as illustrated in Fig. 1. The opposite ends of the thermoelectric elements 16 and 18 necessarily are hot or heat generating junctions.

The cell storage chamber 12 is a rectangular closed chamber of the length to accommodate the thermoelectric elements 16 and 18 when they are longitudinally stored therein with the cold junction ends exposed to the refrigerated chamber 14. To this end the connecting bridge 20 is provided with circular apertures to receive the elements 16 and 18 and to form the thermoelectric junctions. The connecting bridge 20 extends from a top wall 24 to a bottom wall 26 for the chamber 12 to thereby define a partition between the chamber 12 and the chamber 14.

Figure 2:
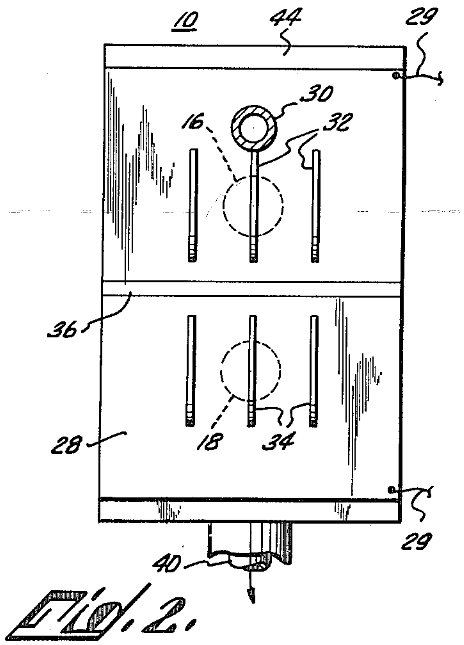
Fig. 2 is a front elevational view of the thermoelectric device of Fig. 1.

The hot end of the elements 16 and 18 are suitably supported adjacent an outer wall 28 provided with a heat transfer fluid conduit 30 arranged above the topmost thermoelectric element, in this instance the element 16. The conduit 30 is connected to a source of heat transfer fluid (not shown) and which fluid may be the ambient air. The elements 16 and 18 are each provided with external radiators 32 and 34 respectively for dissipating the heat from the hot junctions. The radiators 32 and 34 may comprise a plurality of fins spaced apart and connected to the outer wall 28; see Fig. 2. The series circuit from the direct current source 22 is completed from the lead wires 29 connected to the outer wall 28, through the thermoelectric elements 16 and 18 by means of the electrically conducting walls for the chamber 12. The circuit is further defined by the provision of electrical insulating members 36 and 38. The insulating member 36 is arranged to electrically divide the outer wall to thereby electrically isolate the thermoelectric elements 16 and 18 except by means of the thus defined series circuit. The electrical insulating members 37 and 38 are arranged adjacent the outer end of the connecting bridge 20 and abutting the top wall 24 and the wall 26 to electrically insulate these latter two walls.

The refrigerated chamber 14 is of the same general shape as the chamber 12 but in this instance a refrigerated fluid conduit 40 is provided adjacent the bottom of the outer wall 42 for the refrigerated chamber 14. The conduit 40 passes the refrigerated fluid from the chamber 14 to be utilized at a remote location. The outer walls 42 for the chamber 14 are provided with a heat insulating material 44 to prevent the leakage of cold therefrom.

Considering the thermoelectric elements 16 and 18 per se the construction and arrangement of same will be examined. It is presently known that the usable cooling produced by a thermoelectric junction is equal to the net thermoelectric effect produced by the Peltier and Thomson effects at the cold junctions less a portion of the electrical resistive losses in the electrical legs of the series circuit and the heat dissipated by thermal conduction in flowing from the hot to the cold junction. Furthermore, it can be shown that the performance of a thermoelectric device is limited by the heat loss. The lowest temperature possible may be approximated by Formula 1 below:

$$(T_H - T_C)_{max} = \frac{ZT_C^2}{2} \qquad (1)$$

wherein $T_H$ and $T_C$ are the hot and cold junction absolute temperatures and which temperatures are dependent on the thermoelectric materials employed. In the instance where the two legs of a device do not differ in thermal (K) or electrical conductance ($1/R$)—

$$Z = \frac{(a_1 - a_2)^2}{KR} \qquad (2)$$

wherein $a_1$ and $a_2$ are the thermoelectric coefficients of the two thermoelectric materials at $T_C$ referred to some standard thermoelectric material.

Figure 3:
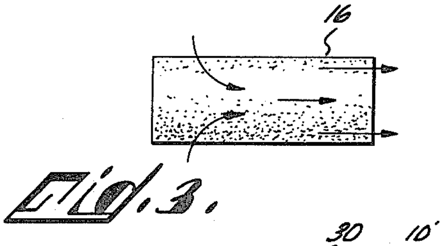
Fig. 3 is an enlarged cross-sectional view of the thermoelectric element of Fig. 1 showing the porosity.
Figure 4:
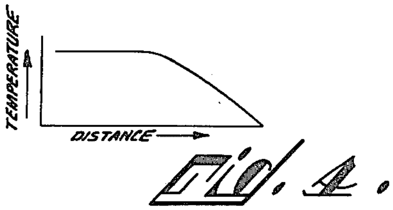
Fig. 4 is a graphical representation of a typical temperature gradient for a thermoelectric element of this invention.

With this in mind, it is proposed by the present invention to control the heat loss through the provision of a means for the transfer of heat to a fluid which flows along the axes of the thermoelectric elements 16 and 18; see Fig. 3. This control of heat loss results upon arranging the thermoelectric elements 16 and 18 to have a non-linear temperature gradient at least between the hot and cold junctions. A typical non-linear temperature characteristic in accordance with this invention is illustrated in Fig. 4. Presently known thermoelectric elements have an approximately linear temperature gradient. It will be seen from an examination of Fig. 4, that the temperature gradient may be generally characterized as being substantially linear adjacent the hot junction and concave downward adjacent the cold junction. Alternatively, it may be expressed that the elemental changes in temperature ($\Delta T$) adjacent the hot junction are small while the elemental changes in temperature ($\Delta T$) adjacent the cold junction define a steep sloping line.

This non-linear characteristic may be accomplished by making the legs of the thermoelectric elements 16 and 18 of porous material. The porosity required for the purposes of this invention results from the preparation of semi-conductor thermoelectric elements by the methods of powder metallurgy such as by compacting the powdered material and sintering. Materials that may be utilized are lead telluride, PbTe, lead selenide, PbSe, and bismuth telluride, $Bi_2Te_3$, the latter of which is thought to be the best material presently known and is commercially available from the United Mineral & Chemical Corporation, 16 Hudson Street, New York 13, New York. Other materials that may be used are disclosed and described in an article appearing in "Military Electronics" on pages 16–22 for October 1957.

Referring once again to Fig. 1, it will be seen that upon applying the voltage from the source 22 to the thermoelectric device 10 as well as passing the heat transfer fluid through the conduit 30 the cooling action will result. The heat transfer fluid will pass from the conduit 30 into the chamber 12 and finally into the refrigerated chamber 14.

It should be noted, however, that the only means of passing the heat transfer fluid into the refrigerated chamber 14, is by means of the porosity provided for the theremoelectric elements 16 and 18, as illustrated. The path of the heat transfer fluid is along the axis of the elements 16 and 18 and adjacent the cold junctions to spill into the refrigerated chamber 14. As the heat transfer fluid passes through the elements 16 and 18 it will be cooled as well as being cooled at the cold junction. The usable cooling effect produced by the thermoelectric device 10 may be in part at the cold junction and in part by the use of the cooled fluid. It may also be arranged as in air cooling applications, in which air acts as the heat transfer fluid, that all the cooling is effected by the air.

It will now be appreciated that a novel and improved thermoelectric device has been provided wherein the heat loss has been controlled by allowing a heat transfer fluid to flow towards the cold junction to give a temperature gradient having a nonlinear characteristic. Accordingly, this has resulted in a lower rate of heat loss than heretofore thought possible or an overall cooling to lower temperatures.

Figures 5, 6:
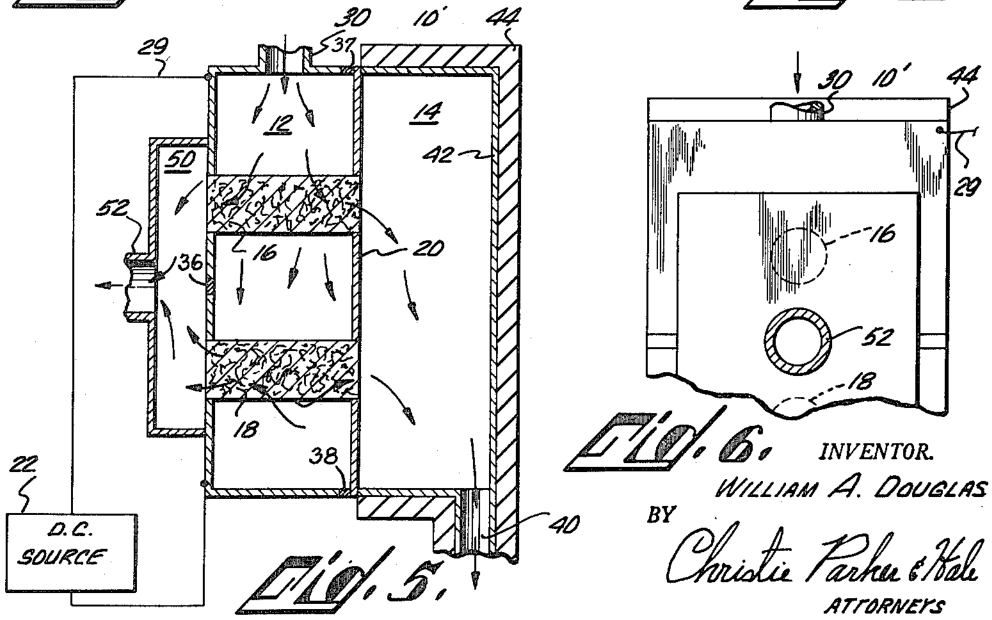
Fig. 5 is a cross-sectional view of another thermoelectric device embodying the invention.
Fig. 6 is a front elevational view of the thermoelectric device of Fig. 5.

Referring now to Figs. 5 and 6, a modified thermoelectric device 10′ will be described. The thermoelectric device 10′ is of the same general type as described except that the heat radiators 32 and 34 have been replaced by a chamber 50 for receiving and passing the heated heat transfer fluid from the thermoelectric elements 16 and 18. The chamber 50 is provided on the front face of the device 10′ and is arranged to enclose the hot junctions for the elements 16 and 18. In this instance the hot junctions are arranged to face into the chamber 50 in the same manner the cold junctions face into the chamber 14. The chamber 50 is provided with a conduit 52 to pass the heated fluid away from the device 10′.

It will be seen that the fluid entering from the conduit 30 into chamber 12 will be provided with a pair of paths, either into the refrigerated chamber 14 or the hot chamber 50 by means of the porosity provided for the elements 16 and 18. The fluid passing adjacent the hot junction will be heated while the fluid passing adjacent the cold junction will be cooled. This thermoelectric action will also control the heat loss through the provision of a non-linear temperature gradient as described for Fig. 1 and produce lower temperatures.

What is claimed is:

1. A thermoelectric element including powdered thermoelectric material sintered and compacted to allow the passage of a fluid therethrough whereby the material exhibits a non-linear temperature gradient to prevent the leakage of cold from a cold junction formed thereon.

2. A thermoelectric element including a semi-conductor thermoelectric material prepared by the methods of powder metallurgy to have a porosity to allow the passage of a heat transfer fluid therethrough whereby the material exhibits a non-linear temperature gradient.

3. A thermoelectric device comprising a plurality of spaced apart electrical conducting elements each having a pair of spaced apart thermoelectric junctions thereon connected in a series circuit relationship, and circuit means for applying a direct current through said elements to cause one of the junctions to be a hot junction and the other a cold junction, said elements being arranged in a thermally insulated storage chamber with the cold junctions facing into another thermally insulated refrigeration chamber, each of said chambers having a conduit connected thereto for passing a heat transfer fluid from one chamber to the other adjacent the cold junctions of said elements.

4. A thermoelectric device as defined in claim 3 wherein said electrical conducting elements are porous and provide the only means of passing the heat transfer fluid from said storage chamber to said refrigerated chamber.

5. A thermoelectric device comprising a pair of thermally insulated chambers, one of said chambers having at least a pair of porous semiconductor rods arranged therein with one end of said rods facing into the other chamber, one of said rods being N-type and the other P-type semiconductors to form a heat absorbing junction at the ends facing into said other chamber and a heat generating junction at the opposite end, circuit means connecting a direct current source to said one chamber to pass direct current through said rods in a series circuit relationship, means associated with said rods and said one chamber for dissipating the heat generated adjacent said heat generating junction, and means for introducing a heat transfer fluid into said one chamber and by means of said rods into said other chamber.

6. A thermoelectric device comprising a pair of chambers, one of said chambers having at least a pair of porous thermoelectric elements arranged therein with one end of each of said elements facing into the other chamber, said elements having a heat absorbing junction and a heat generating junction formed adjacent the opposite ends thereof in accordance with the direction of current flow therethrough and with the heat absorbing junction arranged to face into the said other chamber, circuit means connecting a direct current source to said one chamber to pass direct current through said elements in a series circuit relationship, and means for introducing a heat transfer fluid into said one chamber whereby the fluid passes out of the one chamber solely by means of the porosity of said elements to thereby cause the thermoelectric elements to exhibit a non-linear temperature gradient intermediate the heat absorbing and heat generating junctions.

7. A thermoelectric device comprising a pair of chambers, one of said chambers having at least a pair of porous semi-conductor rods arranged therein with one end of said rods facing into the other chamber, one of said rods being N-type and the other P-type semi-conductors to form a heat absorbing junction at the ends facing into said other chamber and a heat generating junction at the opposite end, circuit means connecting a direct current source to said one chamber to pass direct current through said rods in a series circuit relationship to provide the above defined junctions, and means for introducing a heat transfer fluid into said one chamber whereby the porosity of said rods allow the fluid to pass out of the chamber through each of said junctions whereby the rods are caused to exhibit a non-linear temperature gradient between the junctions formed thereon.

8. A thermoelectric element comprising a thermoelectric material prepared to have a porosity to allow the passage of a heat transfer fluid therethrough between a pair of junctions formed thereon whereby the material exhibits a non-linear temperature gradient between the pair of junctions formed thereon.

References Cited in the file of this patent

UNITED STATES PATENTS

| | | |
|---|---|---|
| 2,289,152 | Telkes | July 7, 1942 |
| 2,651,700 | Gans | Sept. 8, 1953 |
| 2,727,632 | Mack | Dec. 20, 1955 |
| 2,779,172 | Lindenblad | Jan. 29, 1957 |
| 2,836,641 | Vogt | May 27, 1958 |
| 2,870,610 | Lindenblad | Jan. 27, 1959 |